United States Patent
Yilmaz et al.

(10) Patent No.: US 7,553,700 B2
(45) Date of Patent: Jun. 30, 2009

(54) CHEMICAL-ENHANCED PACKAGE SINGULATION PROCESS

(75) Inventors: Hamza Yilmaz, Saratoga, CA (US); Anthony Chia, Singapore (SG); Xiaoguang Zeng, Shanghai (CN); Wong Hie Ming, Singapore (SG); Liming Wang, Shanghai (CN); Yiju Zhang, Shanghai (CN)

(73) Assignee: GEM Services, Inc., Santa Clara, CA (US)

( * ) Notice: Subject to any disclaimer, the term of this patent is extended or adjusted under 35 U.S.C. 154(b) by 590 days.

(21) Appl. No.: 10/843,867

(22) Filed: May 11, 2004

(65) Prior Publication Data

US 2005/0255634 A1    Nov. 17, 2005

(51) Int. Cl.
*H01L 21/44*    (2006.01)
(52) U.S. Cl. ...................................... 438/113; 438/691
(58) Field of Classification Search ................. 438/113, 438/691
See application file for complete search history.

(56) References Cited

U.S. PATENT DOCUMENTS

| | | |
|---|---|---|
| 5,172,214 A | 12/1992 | Casto |
| 6,143,981 A | 11/2000 | Glenn |
| 6,355,502 B1 | 3/2002 | Kang et al. |
| 6,420,779 B1 | 7/2002 | Sharma et al. |
| 6,437,429 B1 | 8/2002 | Su et al. |
| 6,476,478 B1 | 11/2002 | Swiss et al. |
| 6,583,499 B2 | 6/2003 | Huang et al. |
| 6,630,728 B2 | 10/2003 | Glenn |
| 6,812,552 B2 * | 11/2004 | Islam et al. .................. 257/666 |
| 6,841,414 B1 * | 1/2005 | Hu et al. ...................... 438/106 |
| 6,951,801 B2 * | 10/2005 | Pozder et al. ............... 438/462 |
| 2004/0040856 A1 * | 3/2004 | Hamano ...................... 205/123 |

OTHER PUBLICATIONS

Duffek et al., "Etching in Printed Circuit Handbook", Chapter 6 C.F. Coombs, Ed. (McGraw-Hill, New York, 1967).
Orbis Technologies, Ltd., Drilling & De-Smearing Flexible Printed Circuits, http://www.orbitech.col.uk/appst01.html, printed Aug. 17, 2004.
Sigma, Etching Process, http://www.sigma-mecer.com/chem..html, printed Aug. 17, 2004.

* cited by examiner

*Primary Examiner*—Mark Prenty
(74) *Attorney, Agent, or Firm*—Townsend and Townsend and Crew LLP

(57) ABSTRACT

Singulation of individual electronic packages fabricated as part of a common matrix, is accomplished by mask patterning and chemical exposure in combination with physical sawing. In one embodiment of a singulation process in accordance with the present invention, an initial, shallow saw cut into inter-package regions of the matrix exposes underlying metal to subsequent chemical etching steps. In an alternative embodiment, a separate photoresist mask may be patterned over the matrix to selectively expose metal in inter-package regions to chemical etching.

9 Claims, 6 Drawing Sheets

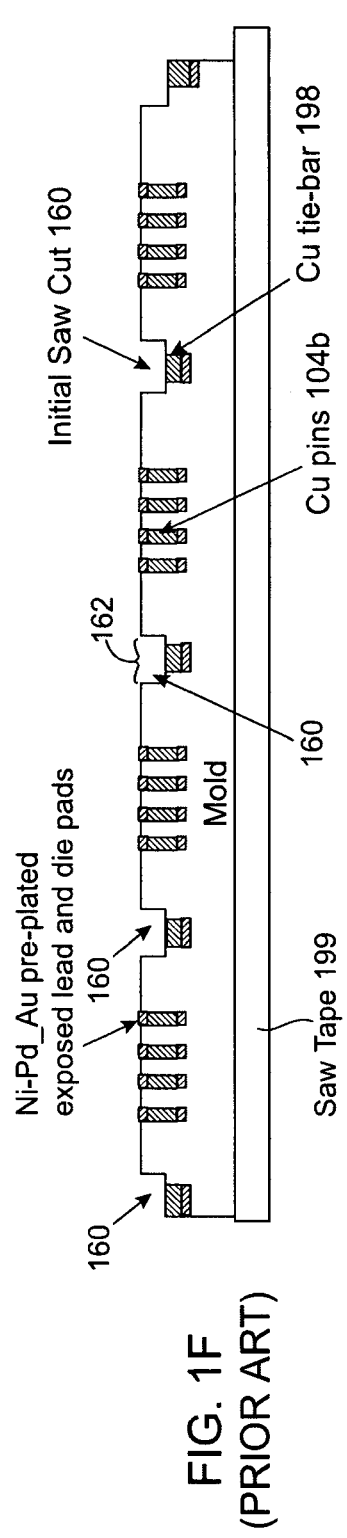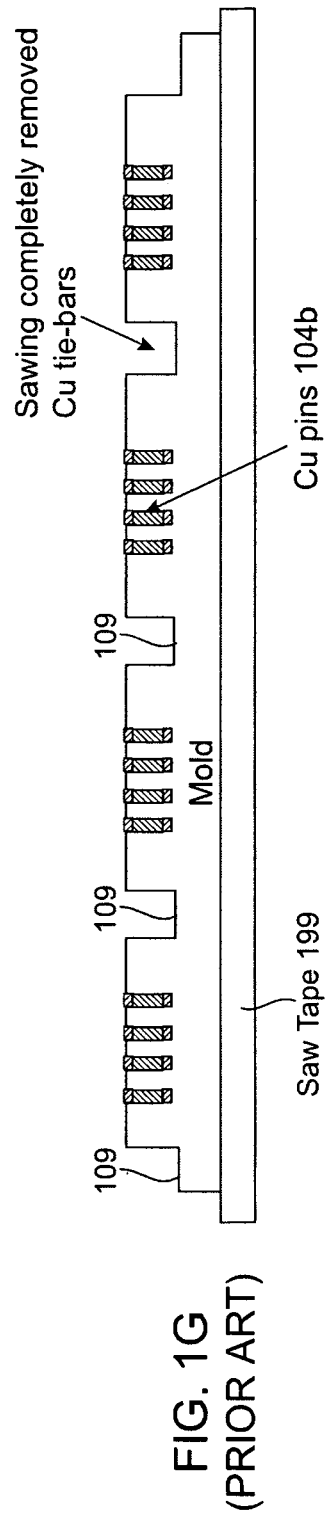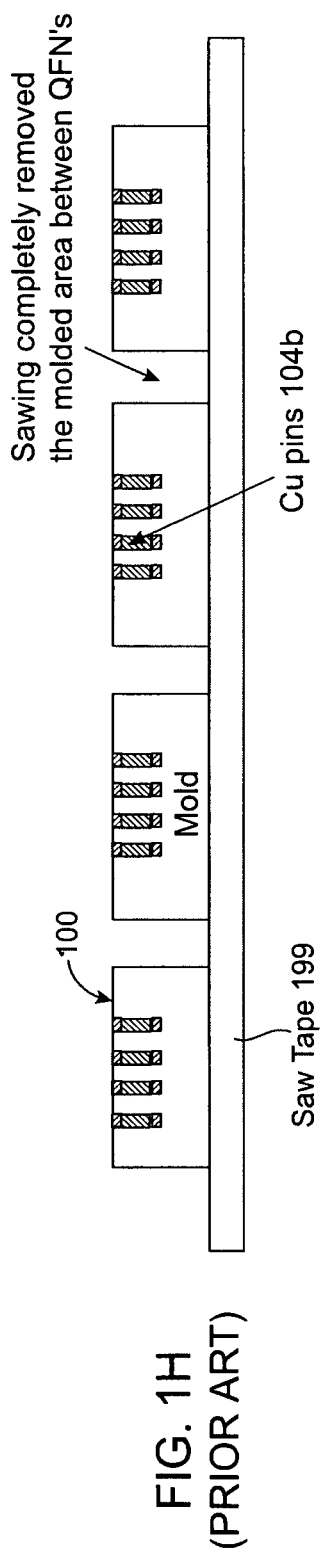
FIG. 1F (PRIOR ART)
FIG. 1G (PRIOR ART)
FIG. 1H (PRIOR ART)

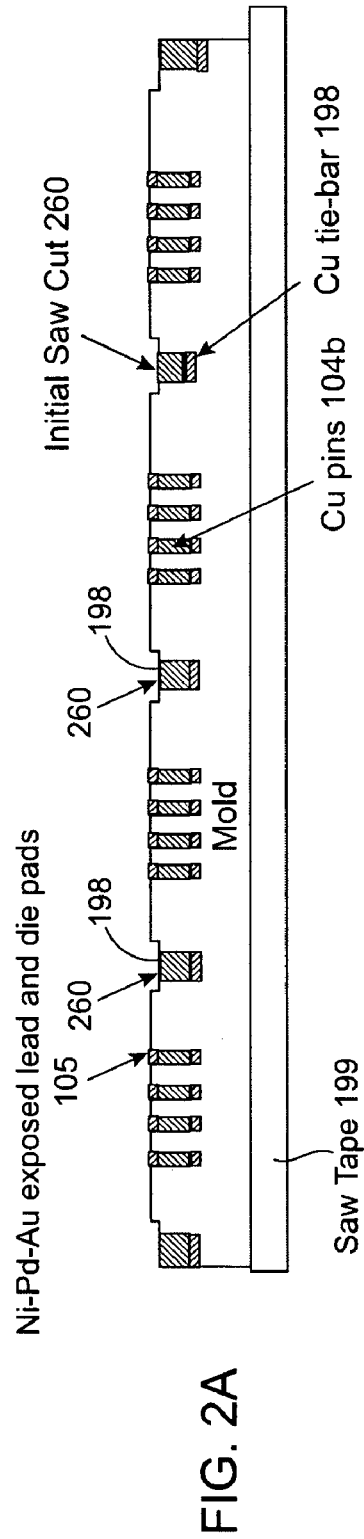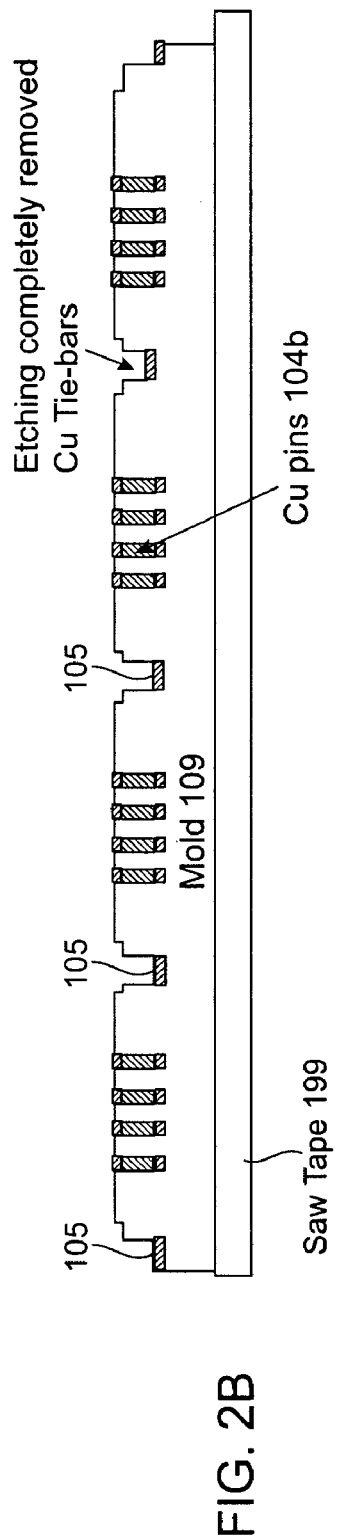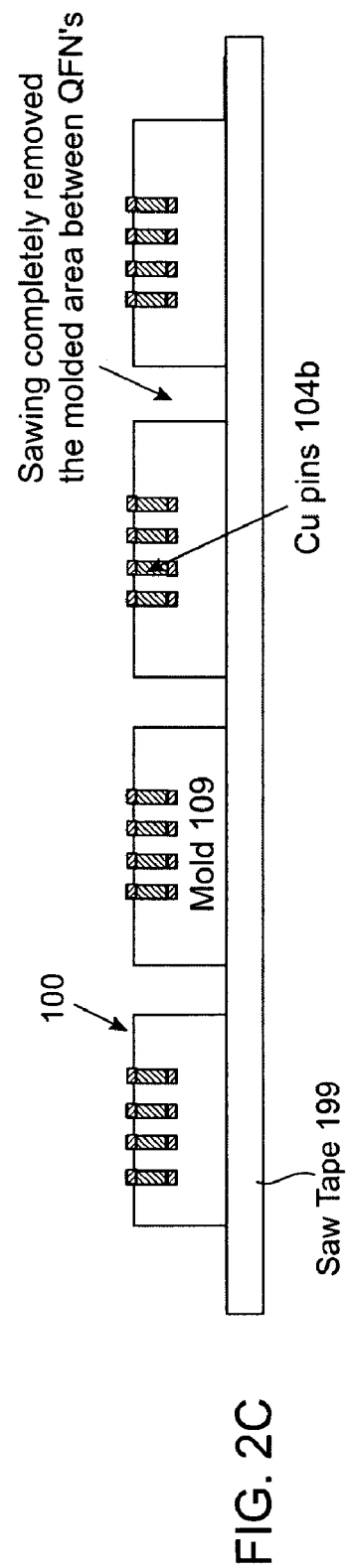

CHEMICAL-ENHANCED PACKAGE SINGULATION PROCESS

BACKGROUND OF THE INVENTION

FIG. 1A shows an underside plan view of a conventional quad flat no-lead (QFN) package utilized to house a semiconductor device. FIG. 1B shows a cross-sectional view taken along line B-B', of the conventional QFN package of FIG. 1A, positioned on a PC board.

QFN package 100 comprises semiconductor die 102 having electrically active structures fabricated thereon. Die 102 is affixed to underlying diepad 104a portion of lead frame 104 by die attach adhesive 106. The relative thickness of the die and lead frame shown in FIG. 1B, and all other drawings of this patent application, is not to scale. Lead frame 104 also comprises non-integral pin portions 104b in electrical communication with die 102 through bond wires 108. Bond wires 108 also allow electrical communication between die 102 and diepad 104a.

Plastic molding 109 encapsulates all but the exposed portions 104a' and 104b' of the lead frame portions 104a and 104b, respectively. For the purposes of this patent application, the term "encapsulation" refers to partial or total enveloping of an element in a surrounding material, typically the metal of the lead frame within a surrounding dielectric material such as plastic.

Portions of the upper surface of lead frame 104 bear silver (Ag) 105 formed by electroplating. The lower surface of lead frame 104 bears a layer of Solder; Lead-Tin, Tin or, Tin Alloys for Lead-free products. Both the lower and upper surfaces of lead frame 104 bears a layer of Ni—Pd—Au or Ni—Au 107 formed by electroplating for the pre-plated lead frames for QFN.

QFN package 100 is secured to traces 110 of underlying PC board 112 by solder 114 that preferably has the rounded shape indicated. The electrically conducting properties of solder 114 allows electrical signals to pass between lead frame portions 104a and 104b and the underlying traces 110.

The QFN packages just described are typically Fabricated as part of a larger, continuous metal matrix defining the diepads and leads. Individual packages are then singulated from the matrix by physical means such as sawing to sever the metal connections.

FIG. 1C shows a plane view of a matrix 196 of QFN packages prior to singulation. FIG. 1D shows an enlarged cross-sectional view showing the diepad and leads of an individual package taken along the line 1D-1D' of FIG. 1C. FIG. 1D shows that the molded matrix 196 of packages is supported by saw tape 199.

FIG. 1E shows a cross-sectional view of the inter-package region of FIG. 1C, taken along the line 1E-1E'. FIG. 1E shows that leads 104b of adjacent packages are formed from a common, integral piece of metal known as a tie-bar 198. Conventionally, the individual packages are singulated from the common matrix by physical sawing along "saw streets" 192 in inter-package regions comprising these common metal tie-bars. The line 1E-1E' represents such a saw street.

FIG. 1F shows a simplified cross-sectional view along line 1E-1E' of the package matrix of FIG. 1C with pre-plated Ni—Pd—Au lead frames, after an initial step of the conventional sawing package singulation process. Initial saw cut 160 is of sufficient width 162 to remove the entirety of the Ni/Pd/Au plating 105 and a portion of the underlying Cu alloy of the tie-bar 198 along the saw street.

FIG. 1G shows a simplified cross-sectional view along line 1E-1E' of the package matrix of FIG. 1C, after continued sawing during the package singulation process. FIG. 1G shows complete removal of the Cu alloy of the connecting metal tie-bar, with the adjacent packages held together in the matrix only by common plastic molding 109 supported by underlying saw tape 199. Because the leads 104b of individual packages of FIG. 1G no longer share a common piece of metal, they are electrically isolated from one another.

FIG. 1H shows a simplified cross-sectional view along line 1E-1E' of the package matrix of FIG. 1C, after a final step of the conventional sawing package singulation process. In FIG. 1H, sawing is continuous through the plastic mold 109, thereby completely physically separating the individual packages, which now remain bound together only by underlying saw tape 199. Singulated packages 100 may now be plucked from saw tape 199 for mounting within an electronic apparatus.

The conventional package singulation process illustrated above in FIGS. 1C-1H allows for the fabrication of packages by mass-production. However, this conventional singulation process offers a number of potential disadvantages.

One such disadvantage is relatively low throughput. Specifically, the process of sawing through metal material requires considerable care, to ensure continuing electrical integrity of semiconducting structures housed within the packages. In particular, rapid sawing of the metal can generate residual electrical charge that can short-out or otherwise disrupt the electrical connections carefully fabricated within the packages. Accordingly, steps of the conventional package singulation process that involve the sawing of metal are performed slowly and under carefully controlled conditions, reducing throughput of the overall package singulation process.

Therefore, there is a need in the art for improved techniques for fabricating semiconductor device packages.

BRIEF SUMMARY OF THE INVENTION

Singulation of individual electronic packages fabricated as part of a common matrix is accomplished by mask patterning and chemical exposure in combination with physical sawing. In one embodiment of a singulation process in accordance with the present invention, an initial, shallow saw cut into inter-package portions of the matrix exposes underlying metal to subsequent chemical etching steps. In an alternative embodiment, a separate photoresist mask may be patterned over the matrix to selectively expose metal in inter-package regions to chemical etching.

An embodiment of a package singulation process in accordance with the present invention, comprises, patterning a mask to expose inter-package regions of a common fabricated package matrix, removing metal in the inter-package regions by chemical exposure; and then removing remaining material in the inter-package regions by physical sawing.

These and other embodiments of the present invention, as well as its features and some potential advantages are described in more detail in conjunction with the text below and attached figures.

BRIEF DESCRIPTION OF THE DRAWINGS

FIGS. 1E-H show simplified cross-sectional views along line 1E-1E' of FIG. 1C, illustrating various successive stages of a conventional package singulation process.

FIGS. 2A-C show simplified cross-sectional views along line 1E-1E' of FIG. 1C, illustrating various successive stages of one embodiment of a package singulation process in accordance with the present invention.

DETAILED DESCRIPTION OF THE INVENTION

Physical singulation of individual electronic packages fabricated as part of a larger matrix, is accomplished by sawing in combination with chemical exposure and patterning of a mask. In one embodiment of a singulation process in accordance with the present invention, an initial, shallow saw cut into inter-package portions of the matrix exposes underlying metal to subsequent chemical etching steps. In an alternative embodiment of a singulation process in accordance with the present invention, a separate photoresist mask may be patterned over the matrix to selectively expose metal in inter-package regions to chemical etching.

U.S. Nonprovisional patent application Ser. No. 10/751,265 is incorporated herein by reference for all purposes, describes the use of electroplating techniques to form package features. Embodiments of singulation processes in accordance with the present invention may be used to fabricate packages as described in that patent application.

Figure 1A:
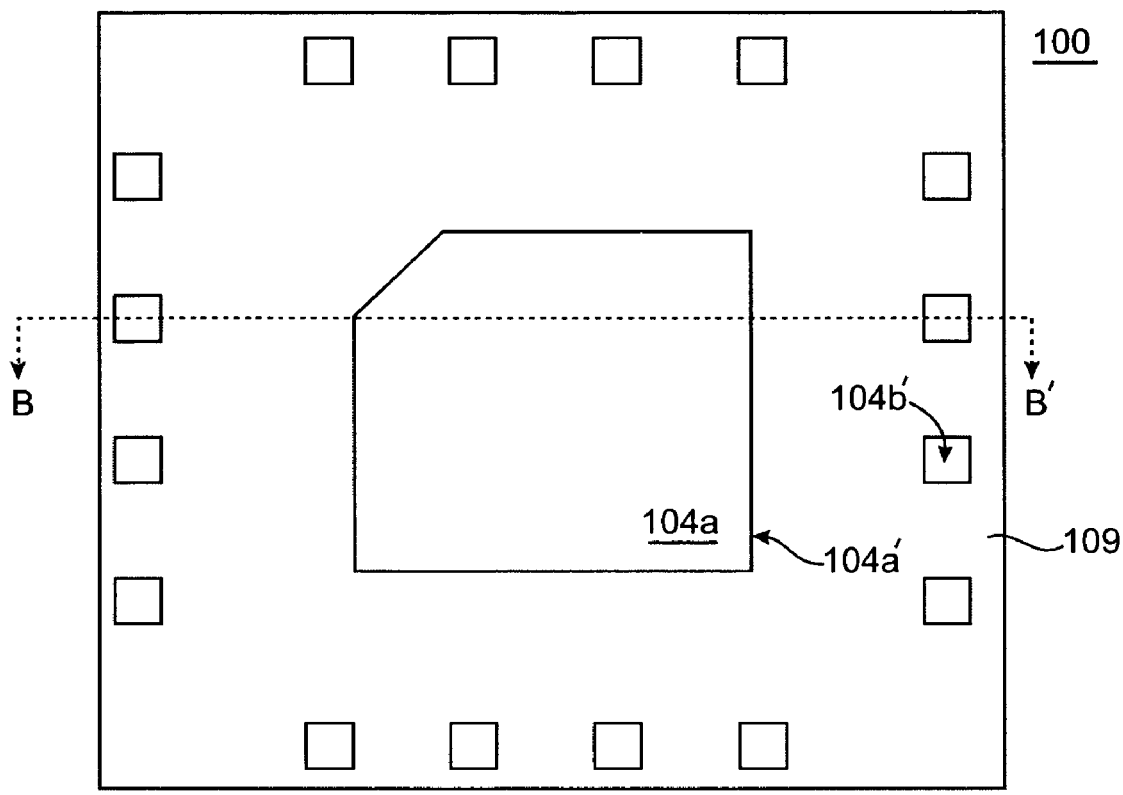
FIG. 1A shows an underside plan view of a conventional QFN package.
Figure 1B:
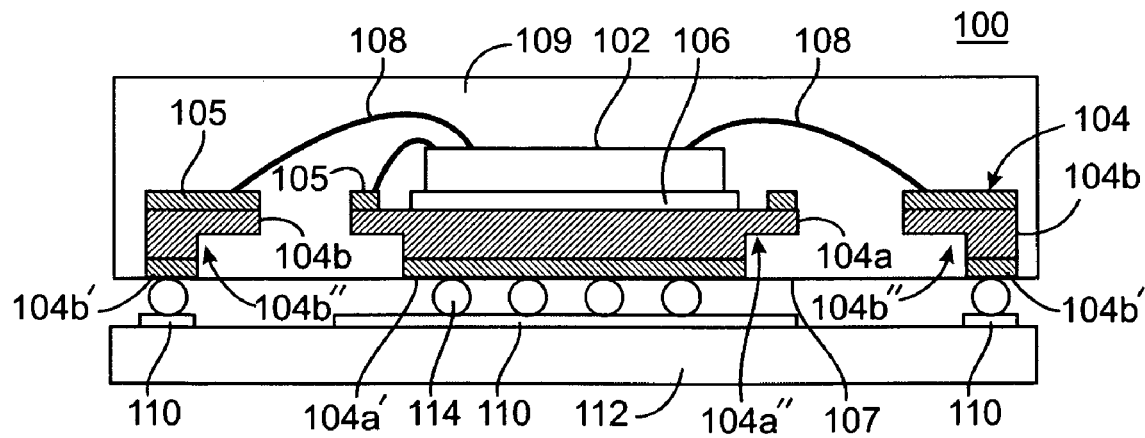
FIG. 1B shows a cross-sectional view of the package of FIG. 1A taken along line B-B'.

A discussion of various embodiments of package singulation processes in accordance with the present invention follows, referencing the completed conventional package matrix shown in FIGS. 1A-B. FIG. 2A shows simplified cross-sectional view taken along line 1E-1E', of the package matrix of FIG. 1C after an initial step of one embodiment of a singulation process in accordance with the present invention.

In FIG. 2A, an initial shallow saw cut 260 has been made to remove only the Ni—Pd—Au stack 105 lying between adjacent packages. This initial sawing step is designated to stop on the underlying copper, a small portion of which may be removed as a result. The width of this sawing step is greater than the tie bar, such that adjacent molding is also physically removed during this step.

Figure 1C:
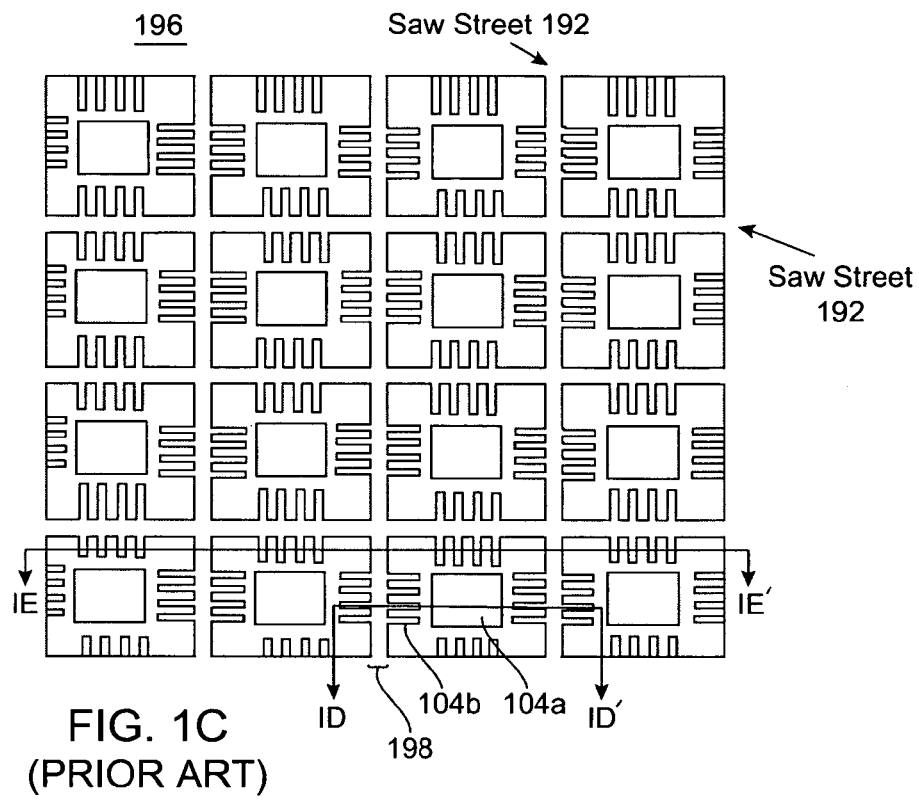
FIG. 1C shows a simplified plan view of a matrix of packages prior to singulation.
Figure 1D:
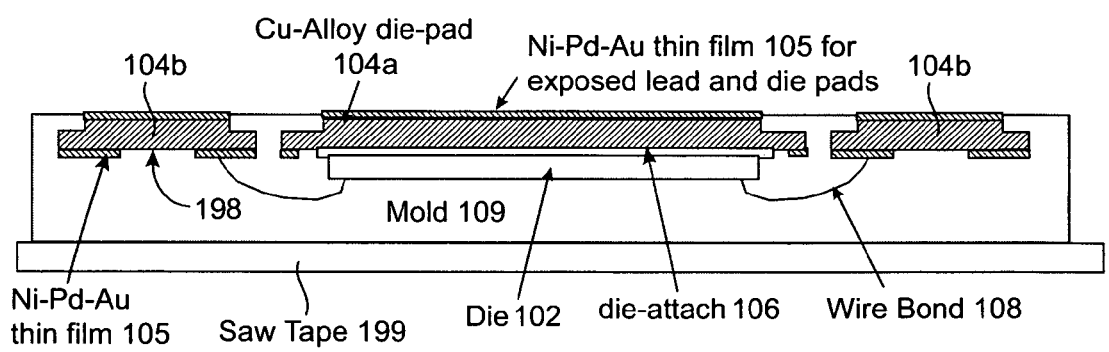
FIG. 1D shows a simplified cross-sectional view along line 1D-1D' of FIG. 1C.

FIG. 2B shows a simplified cross-sectional view taken along line 1E-E' of the package matrix of FIG. 1C after a second step of an embodiment of a singulation process in accordance with the present invention. In FIG. 2B, the matrix is exposed to a wet chemical etchant selective to copper alloy material over the Ni—Pd—Au stack. As a result of this chemical exposure, the copper exposed by the initial sawing step of FIG. 2A is removed by etching, to stop on the Ni of the Ni—Pd—Au stack underlying the copper.

A number of possible etchant systems exist for the selective etching of copper material in accordance with embodiments of singulation processes of the present invention. One such etchant process involves combining sodium, potassium, or ammonium persulfates in an aqueous solution with catalysts such as sulphuric acid. When the persulfate salts dissolve in water, the resulting persulfate ions oxidize copper to cupric ions. Such a chemical reaction involving ammonium persulfate is shown in the following simplified chemical reaction scheme:

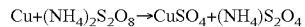

$$Cu + (NH_4)_2S_2O_8 \rightarrow CuSO_4 + (NH_4)S_2O_4$$

An alternative system for the selective removal of copper involves performing sulphuric-peroxide etching. Specifically, mixtures of sulphuric acid and hydrogen peroxide with phosphoric acid can also be used as selective Cu etchant, as shown in the following simplified chemical reaction scheme:

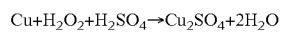

$$Cu + H_2O_2 + H_2SO_4 \rightarrow Cu_2SO_4 + 2H_2O$$

In the manner shown in FIG. 2B, the majority of inter-package copper material is removed by chemical reaction rather than mechanical sawing, thereby avoiding the risk of causing electrical damage to the active devices within in the package. The specific locations of this etching are defined by the shallow saw cuts of the prior brief sawing step, which in essence creates a mask from the remaining Ni—Pd—Au stack and the unsawn molding.

FIG. 2C shows a simplified cross-sectional view taken along line 1E-E' of the package matrix of FIG. 1C after a final step of the singulation process, wherein mechanical sawing is resumed to remove the lower Ni—Pd—Au stack 105 and the underlying plastic molding 109, thereby resulting in full singulation of the packages. Owing to the relative thinness of the Ni—Pd—Au stack 105, this resumed sawing step is relatively brief and does not overly degrade throughput of the package singulation process.

The process illustrated in FIGS. 2A-C represents only one specific example in accordance with the present invention, and variations of this process fall within the scope of the present invention. For example, the final sawing step depicted in FIG. 2C could actually occur in two separate steps.

In a first step, the sawing could resume only long enough to remove the Ni—Pd—Au stack 105. The sawing could then be paused, allowing for parallel testing of now-electrically isolated packages in strip form. After such testing, sawing of the remaining molded plastic could be resumed to accomplish complete singulation of the packages.

Moreover, while the specific embodiment shown in FIG. 2C describes removal of the underlying Ni—Pd—Au film stack remaining in inter-package regions by sawing, this is also not required by the present invention. In accordance with an alternative embodiment, the remaining Ni—Pd—Au film could be removed by chemical etchant introduced into inter-package regions. In such an alternative embodiment, the Ni—Pd—Au film stack remaining on the upper surface of the package matrix could be protected from etching during this step by a layer of photoresist formed over the entire surface of the matrix prior to the initial sawing step, and then physically removed from inter-package regions by the initial sawing step.

And while the specific embodiment shown in FIGS. 2A-C describes singulation of packages fabricated on Cu alloy lead frames bearing an electroplated Ni—Pd—Au stack 105 on both surfaces, this is not required by the present invention. In accordance with alternative embodiments, singulation of packages fabricated utilizing other materials may be accomplished.

Figure 3A:
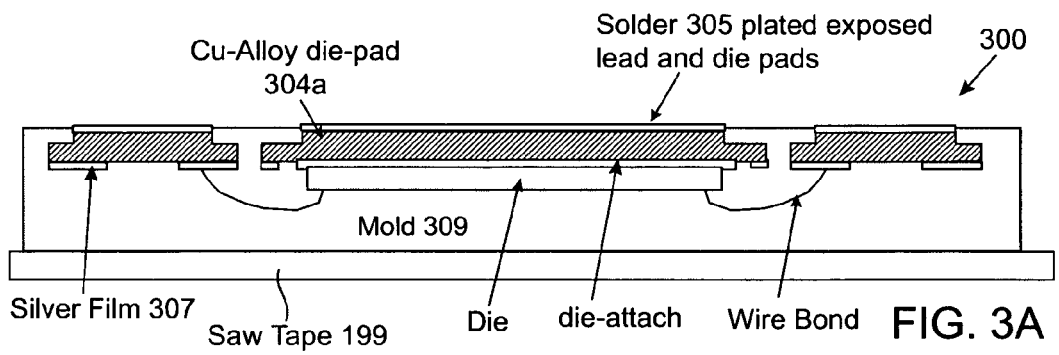
FIG. 3A shows a simplified cross-sectional view of an alternative form of a conventional package.

For example, FIG. 3A shows a simplified cross-sectional view of a package fabricated within a larger matrix. This view is analogous to that shown in FIG. 1B.

The exposed leads 304b and diepads 304a of the package 300 of FIG. 3A bear plated solder 305 rather than a Ni—Pd—

Au film stack. The non-exposed surfaces of the Cu alloy leads and diepads of the package of FIG. 3A bear silver plated film 307 specifically patterned in selected locations.

Figure 1E:
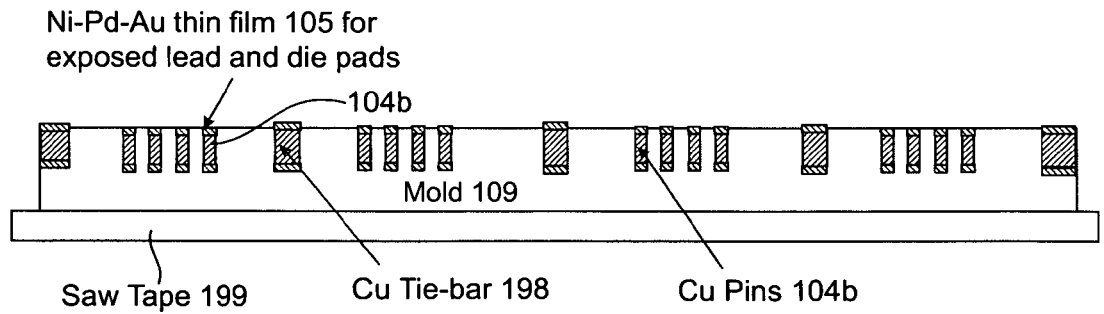
Figure 3B:
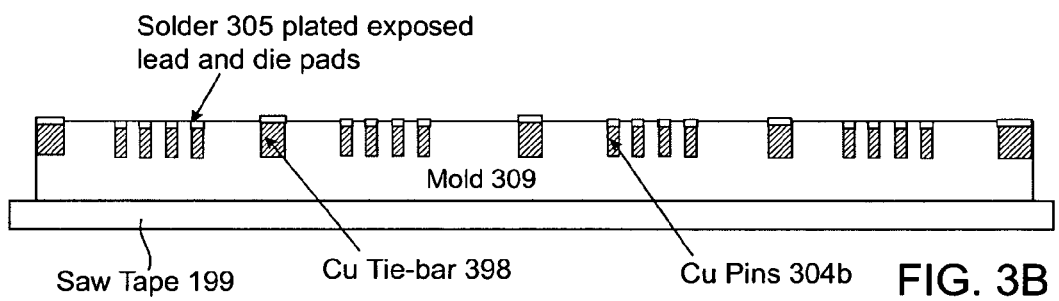
FIGS. 3B-3E shows simplified cross-sectional views illustrating various successive stages of an embodiment of a process in accordance with the present invention for singulation the package of FIG. 3A.

FIG. 3B shows a simplified cross-sectional view of a matrix of packages of the type shown in FIG. 3A, taken along inter-package regions. This view is analogous to that shown in FIG. 1E.

Figure 3C:
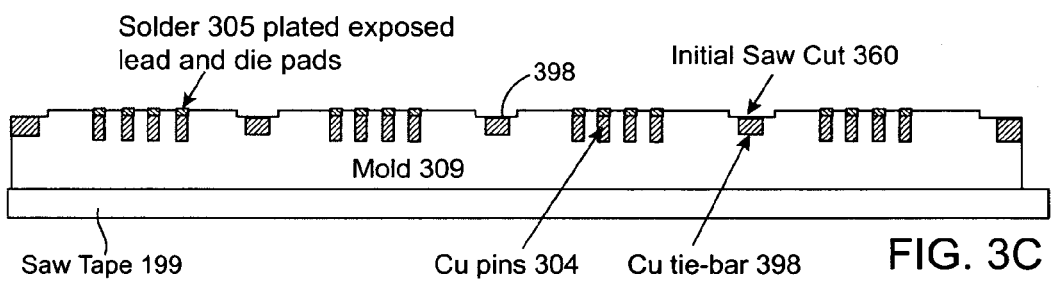

FIG. 3C shows a first step in an alternative package singulation process, wherein an initial shallow saw cut 360 removes the solder in inter-package regions, exposing the underlying Cu alloy of the tie bar 398.

Figure 3D:
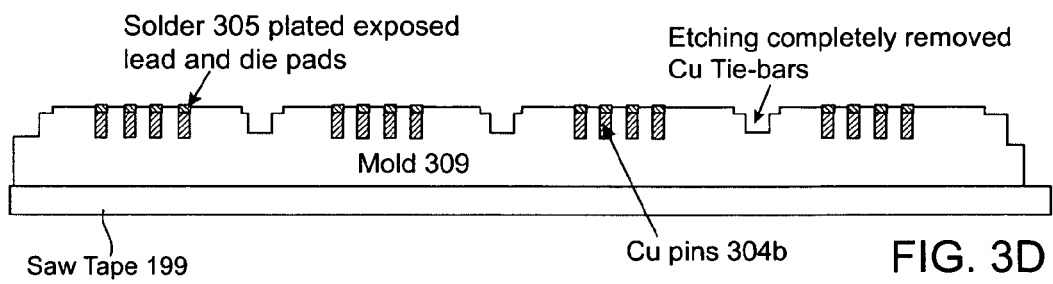

Utilizing portions of the matrix unaffected by the initial saw cut as a mask, FIG. 3D shows a simplified cross-sectional view of a successive step in the singulation process, wherein the exposed Cu alloy of the tie bar is removed by chemical etching. At this point in the singulation process, there is no remaining electrical contact between adjacent packages, and they are thus available for strip testing.

Figure 3E:
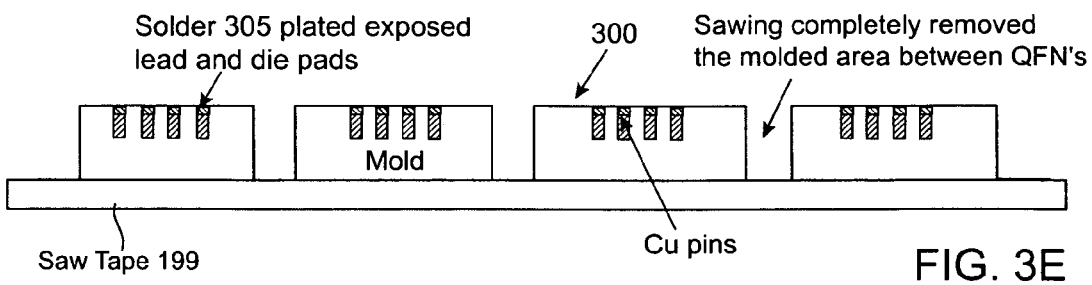

FIG. 3E shows a simplified cross-sectional view of a final step in the singulation process, wherein sawing of exclusively remaining molded plastic material is resumed in inter-package regions in order to complete singulation.

The embodiment shown in FIG. 3A-E is specific to singulation of packages having exposed metal portions plated with solder after encapsulation, rather than relying upon a pre-plated metal stack. This may be motivated by the limited availability and higher cost of the Pd material.

However, because the embodiments utilizing leadframes pre-plated with Ni—Pd—Au do not require the extra solder-plating step, the embodiment of FIGS. 3A-E is generally less preferred. In addition, by avoiding the use of lead-containing solder material, package fabrication process utilizing pre-plated Ni—Pd—Au leadframes offer less toxicity and reduced cost associated with hazardous waste disposal.

In the specific embodiments shown and described thus far, the initial shallow sawing step which removes the surface Ni—Pd—Au film stack, serves to create a mask from the remaining Ni—Pd—Au and plastic mold material not physically removed by the initial sawing. However, in accordance with alternative embodiments of the present invention, a separate masking layer could be deliberately patterned to define inter-package regions for package singulation.

FIGS. 4A-F show simplified cross-sectional views of an alternative embodiment of a package singulation process in accordance with the present invention. The fabricated package matrix shown in FIGS. 1C and 1E are again referenced to provide a starting point for the process. In the cross-sectional view of FIG. 4A, a layer of negative photoresist 480 is spin coated over the package matrix.

Figure 4A:
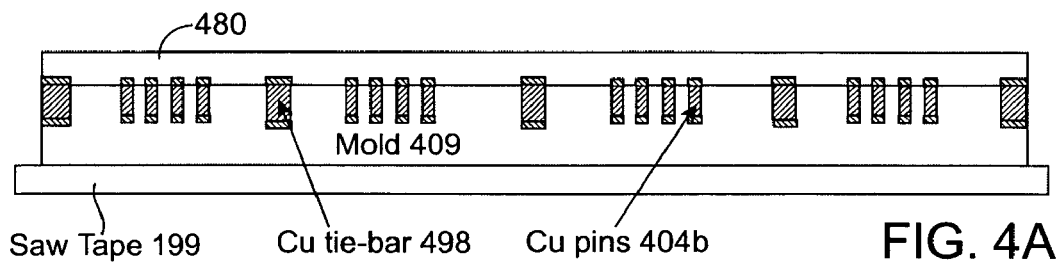
FIGS. 4A-F show simplified cross-sectional views illustrating successive stages of an alternative embodiment of a package singulation process in accordance with the present invention.
Figure 4B:
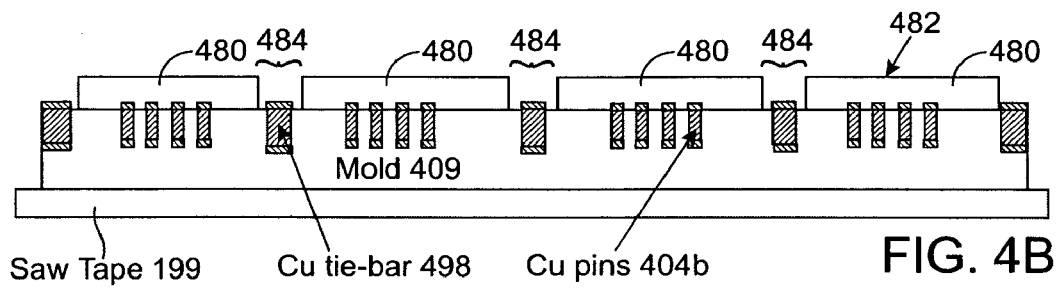

In the simplified cross-sectional view of FIG. 4B, photo-resist 480 is patterned into a mask 482 by selective exposure to incident radiation followed by development. As a result of this patterning process, inter-package regions 484 are revealed by mask 482.

Figure 4C:
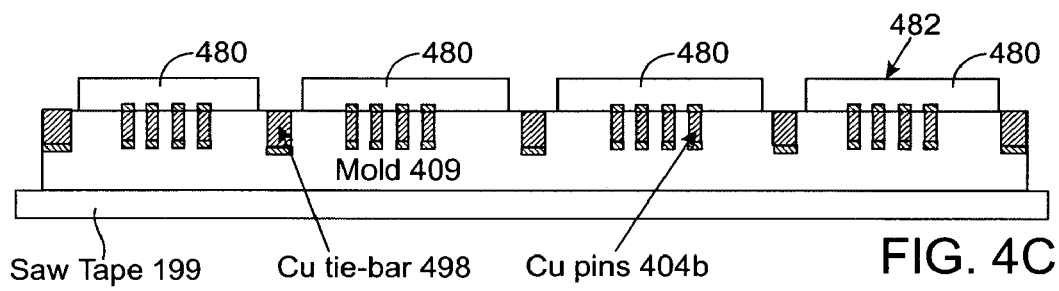

In the simplified cross-sectional view of FIG. 4C, the matrix bearing the developed photoresist mask is exposed to a chemical etchant selective to Ni—Pd—Au stack 405 relative to the underlying Cu alloy of the tie bar 498 and the developed photoresist 480.

Figure 4D:
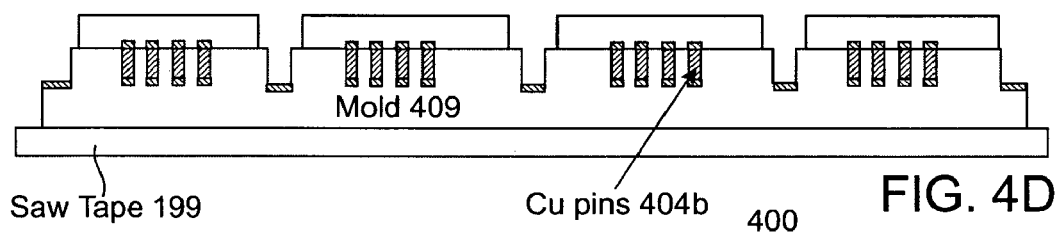

In the simplified cross-sectional view of FIG. 4D, the partially etched matrix bearing the developed photoresist is exposed to a different chemical etchant selective to Cu alloy of tie bar 498 relative to underlying Ni—Pd—Au stack 405 and the developed photoresist 480.

Figure 4E:
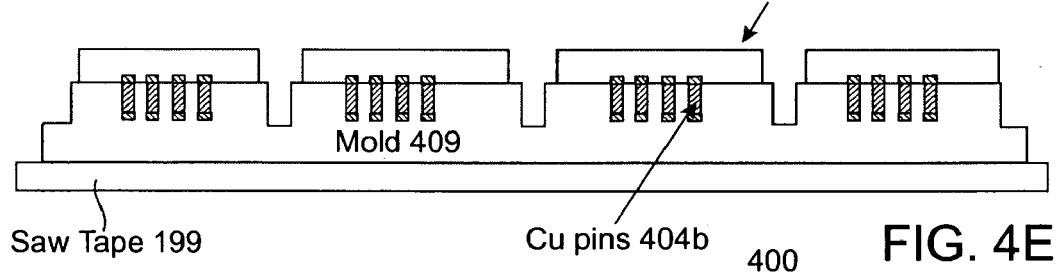

In the simplified cross-sectional view of FIG. 4E, the further etched matrix bearing the developed photoresist 480 is re-exposed to the original chemical etchant of FIG. 4C, thereby removing remaining metal contacts between packages. The packages 400 are now in condition to be strip-tested.

Figure 4F:
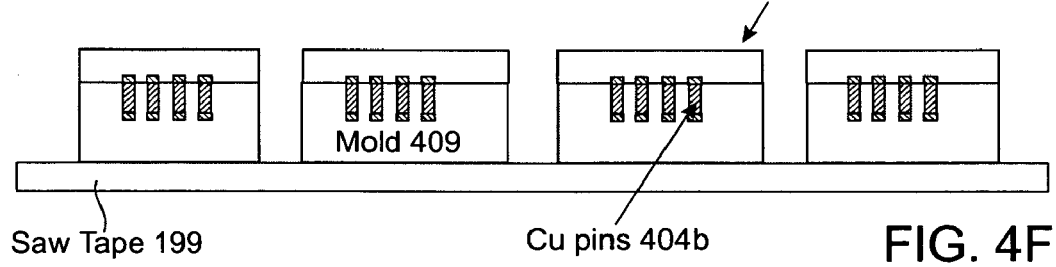

FIG. 4F shows completion of the singulation process by sawing of the plastic mold 409 remaining between adjacent packages 400. As the physical sawing step of FIG. 4F is the only one in the process, the low efficiency and corresponding reduced throughput resulting from metal sawing steps is avoided.

The photoresist material patterned in the process flow illustrated in connection with FIGS. 4A-F, may be removed after either before or after physical sawing to remove the material remaining between packages. The step of removing the photoresist can be accomplished utilizing a variety of techniques. In a preferred approach, the developed photoresist may be stripped by exposure to wet organic cleaner. Less preferably, developed photoresist could be removed by exposure to plasma etching, which could cause electrostatic discharge damage to some pins.

While the specific embodiment of FIGS. 4A-F utilizes development of the photoresist to define the initial mask for etching the Ni—Pd—Au stack in inter-package regions, this is not required by the present invention. In accordance with alternative embodiments, the initial pattern of the photoresist could be created with an initial, shallow sawing step into the photoresist in a manner analogous to that shown in FIGS. 2A and 3C, with removal of the bulk of the metal material of the tie bar still accomplished by etching, rather than by low-efficiency sawing processes.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A package singulation process comprising:
   providing a common fabricated package matrix comprising intra-package regions supporting a die, and inter-package regions;
   patterning a mask to expose inter-package regions, wherein patterning the mask comprises initially sawing into the inter-package regions to expose a metal comprising copper;
   removing the metal in the inter-package regions by chemical exposure; wherein the metal is removed by exposure to a chemical etchant selected from the group consisting of an aqueous solution of persulfate ions and a catalyst, and a mixture of sulphuric acid and hydrogen peroxide with phosphoric acid; and then
   removing remaining material in the inter-package regions by physical sawing.

2. The process of claim 1 wherein the mask comprises plastic molding and a second metal.

3. The process of claim 2 wherein the second metal is selected from the group consisting of solder and a Ni—Pd—Au film stack.

4. The process of claim 2 wherein the remaining material comprises plastic molding.

5. A package singulation process comprising:
   providing a common fabricated package matrix comprising intra-package regions supporting a die, and inter-package regions;
   patterning a mask to expose inter-package regions by initially sawing into the inter-package regions to expose a metal, wherein the mask comprises plastic molding and a second metal;

removing the metal in the inter-package regions by chemical exposure; and then removing remaining material in the inter-package regions by physical sawing, wherein the remaining material comprises plastic molding, the method further comprising strip testing the packages prior to sawing the remaining material.

6. A package singulation process comprising:

providing a common fabricated package matrix comprising intra-package regions supporting a die, and inter-package regions;

patterning a mask to expose inter-package regions by initially sawing into the inter-package regions to expose a metal, wherein the mask comprises plastic molding and a second metal;

removing the metal in the inter-package regions by chemical exposure; and then removing remaining material in the inter-package regions by physical sawing, wherein the remaining material comprises plastic molding, and wherein the remaining material further comprises a third metal overlying the plastic molding, the third metal selected from the group consisting of silver and a Ni—Pd—Au film stack.

7. The process of claim 6 further comprising strip testing the packages after sawing the third metal and prior to sawing the plastic molding.

8. A package singulation process comprising:

providing a common fabricated package matrix comprising intra-package regions supporting a die, and inter-package regions;

patterning a mask to expose inter-package regions, wherein patterning the mask comprises initially sawing into the inter-package regions to expose metal;

removing metal in the inter-package regions by chemical exposure; and then removing remaining material in the inter-package regions by physical sawing, the method further comprising forming a layer of photoresist over the matrix prior to the initial sawing step.

9. The process of claim 8 wherein the remaining material comprises a second metal overlying plastic molding, the process further comprising chemically etching the second metal within the inter-package region prior to sawing the plastic molding.

* * * * *